United States Patent [19]

Hashimoto

[11] Patent Number: 5,675,544
[45] Date of Patent: Oct. 7, 1997

[54] METHOD AND APPARATUS FOR PARALLEL TESTING OF MEMORY CIRCUITS

[75] Inventor: Masashi Hashimoto, Garland, Tex.

[73] Assignee: Texas Instruments Incorporated, Dallas, Tex.

[21] Appl. No.: 873,523

[22] Filed: Apr. 21, 1992

Related U.S. Application Data

[63] Continuation of Ser. No. 544,283, Jun. 25, 1990, abandoned.

[51] Int. Cl.$^6$ .................................................. G11C 29/00
[52] U.S. Cl. .................. 365/201; 365/189.01; 371/10.1; 371/21.1; 371/21.2
[58] Field of Search .................... 365/201, 189.01, 365/189.04; 395/575, 10.1, 425; 371/21.1, 21.2

[56] References Cited

U.S. PATENT DOCUMENTS

| | | | |
|---|---|---|---|
| 4,464,750 | 8/1984 | Tatematsu | 371/21.2 |
| 4,553,225 | 11/1985 | Ohe | 365/201 |
| 4,672,582 | 6/1987 | Nishimura et al. | 365/189.04 |
| 4,692,901 | 9/1987 | Kumanoya et al. | 365/189.04 |
| 4,744,061 | 5/1988 | Takemore et al. | 365/201 |
| 4,868,823 | 9/1989 | White, Jr. et al. | 371/21.3 |
| 4,873,669 | 10/1989 | Furutani et al. | 365/189.01 |
| 4,907,203 | 3/1990 | Wada et al. | 365/238.5 |
| 4,916,700 | 4/1990 | Ito et al. | 371/21.1 |
| 4,951,254 | 8/1990 | Ontrop et al. | 365/201 |
| 4,954,994 | 9/1990 | Hashimoto | 365/230.06 |
| 4,964,130 | 10/1990 | Bowden, III et al. | 371/40.2 |
| 4,996,691 | 2/1991 | Wilcox et al. | 371/68.1 |
| 5,060,230 | 10/1991 | Arimoto et al. | 371/21.2 |
| 5,075,892 | 12/1991 | Choy | 371/21.2 |
| 5,077,689 | 12/1991 | Ahn | 365/201 |
| 5,128,737 | 7/1992 | van der Have | 257/503 |

Primary Examiner—Tod R. Swann
Assistant Examiner—J. Peikari
Attorney, Agent, or Firm—Richard L. Donaldson; William B. Kempler

[57] ABSTRACT

A memory circuit 14 is provided having a data register (20) coupled to the output of the memory cell array (16). The output of the data register (20) may be selectively output, allowing a plurality of memory circuits (14) to be tested in parallel with a substantial increase in efficiency. Furthermore, test data can be written to the memory cell arrays (14) while previous test data is read from the memory circuits for optimum efficiency.

3 Claims, 2 Drawing Sheets

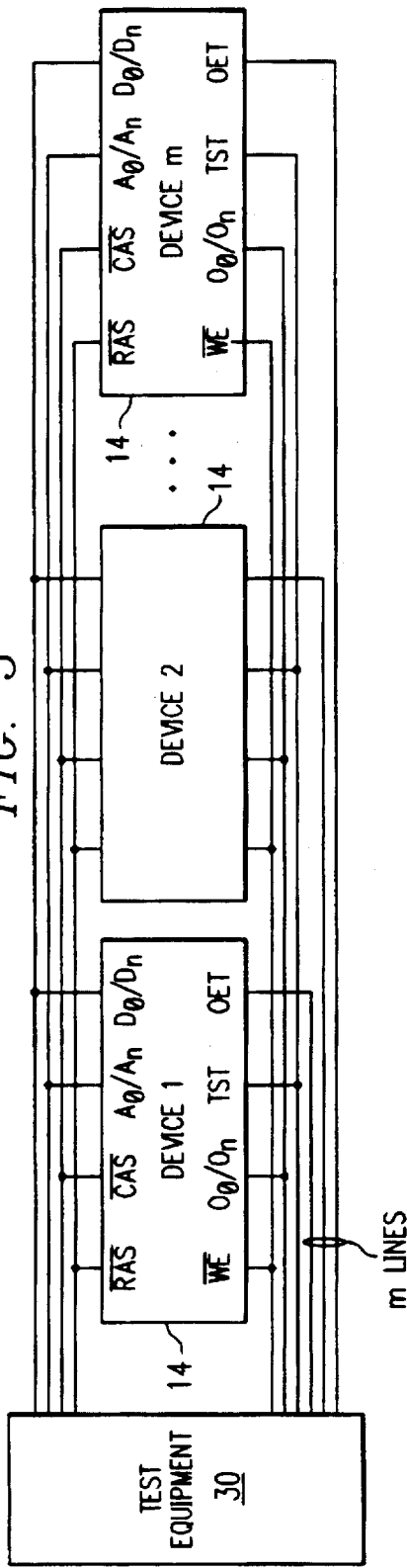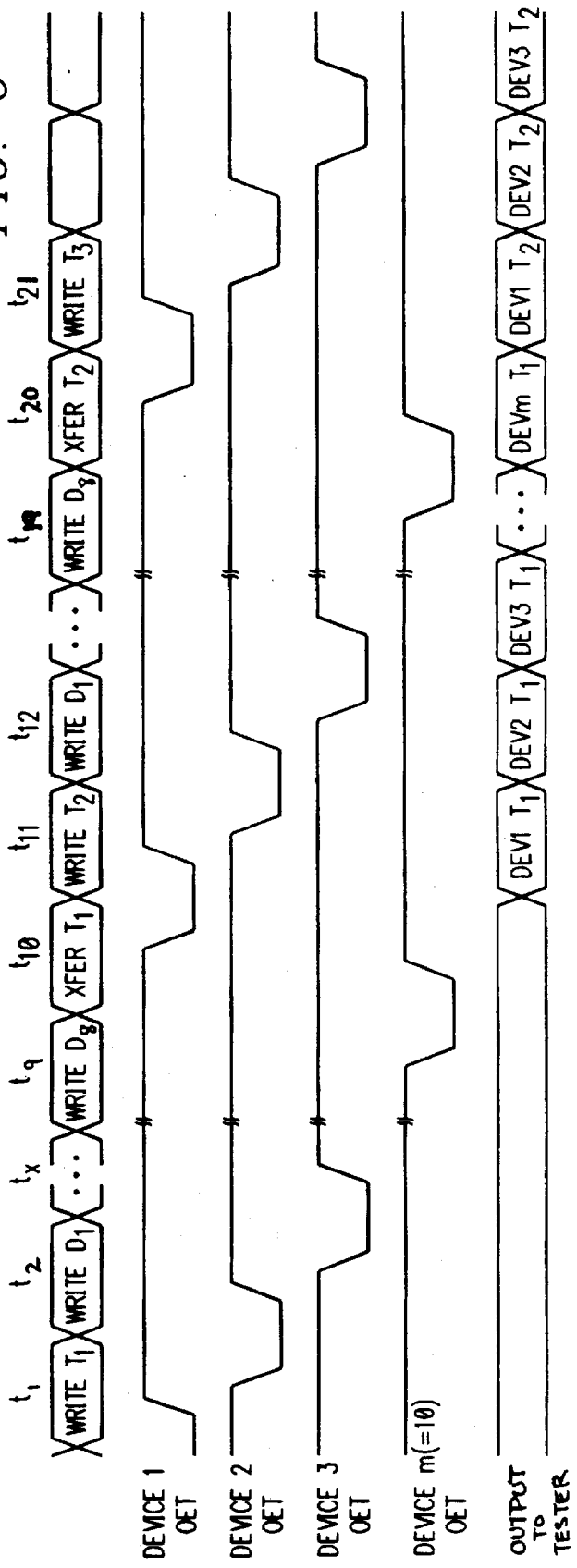

5,675,544

1

METHOD AND APPARATUS FOR PARALLEL TESTING OF MEMORY CIRCUITS

This application is a continuation of application Ser. No. 07/544,283, filed Jun. 25, 1990 now abandoned.

TECHNICAL FIELD OF THE INVENTION

This invention relates in general to integrated circuits, and more particularly to the testing of memory circuits.

BACKGROUND OF THE INVENTION

Testing of memory devices after fabrication is an important aspect involved in the production of integrated circuits. Memory cells typically comprise an array of memory cells. Each memory cell must be tested for its ability to retain data, and in particular, its ability to retain data after one or more disturb cycles in which data is written into adjacent cells. Hence, the testing of each cell in a memory involves writing to a number of cells, reading data from the cell being tested, and continuing the procedure for each cell in the array.

Currently, one megabit memory chips are the standard; it is expected that four megabit memory chips will be the standard within the next few years. Hence, the cell test must be performed on four million cells for each memory chip produced. In the prior art, the test equipment is operable to test only one memory circuit at a time. For a one megabit memory cell, a test time of approximately sixty seconds is required. Hence, the time to check each memory chip on a wafer is very high, adding to the expense of the memory devices.

Therefore, a need has arisen in the industry to provide a method and apparatus for testing multiple memory chips simultaneously.

SUMMARY OF THE INVENTION

In accordance with the present invention, a method and apparatus for testing memories is provided which substantially eliminates the disadvantages associated with prior memory testing devices.

In the present invention, the plurality of integrated circuit memories are tested by reading data from cells associated with each of the plurality of memories. The data read from the memories is stored in respective storage cells associated with each of the memories. The data is then sequentially read from the storage cells.

This aspect of the present invention provides the advantage of simultaneously reading data from a plurality of memories, with the read data stored in a storage cell. Thereafter, the data can be sequentially read from the storage cells by the test equipment. Therefore, testing may be performed in parallel on plurality of memories, vastly increasing the speed of the test.

BRIEF DESCRIPTION OF THE DRAWINGS

For a more complete understanding of the present invention, and the advantages thereof, reference is now made to the following descriptions taken in conjunction with the accompanying drawings, in which.

2

Figure 3:
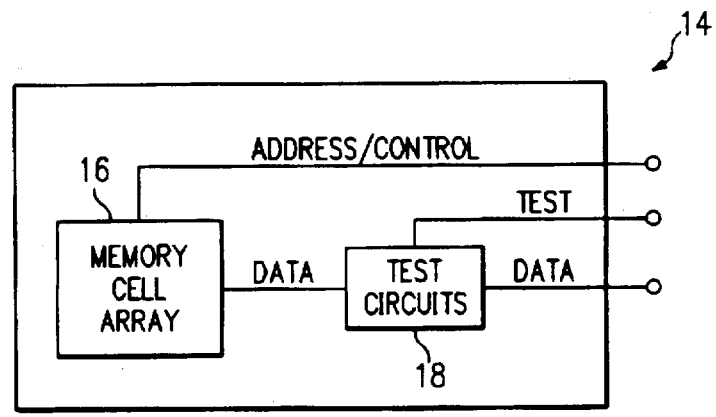
FIG. 3 illustrates a block diagram of the integrated circuit memory of the present invention.
Figure 4:
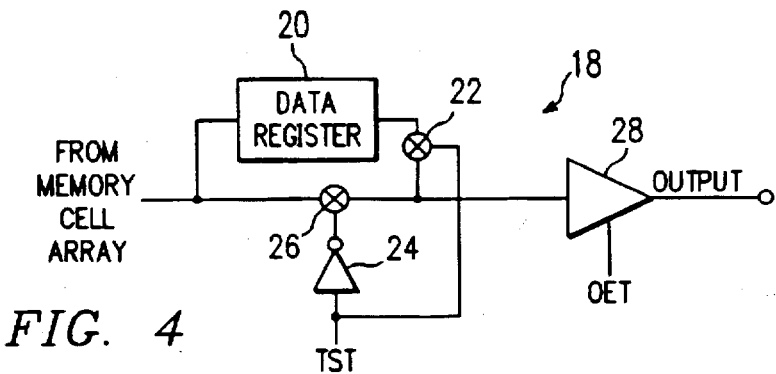

FIG. 4 illustrates the test circuitry shown in FIG. 3;

FIG. 5 illustrates a plurality of memory devices being tested as provided by the present invention; and FIG. 6 illustrates a timing diagram of the test method of the present invention.

DETAILED DESCRIPTION OF THE INVENTION

The preferred embodiment of the present invention is best understood by referring to FIGS. 1–6 of the drawings, like numerals being used for like and corresponding parts of the various drawings.

Figure 1:
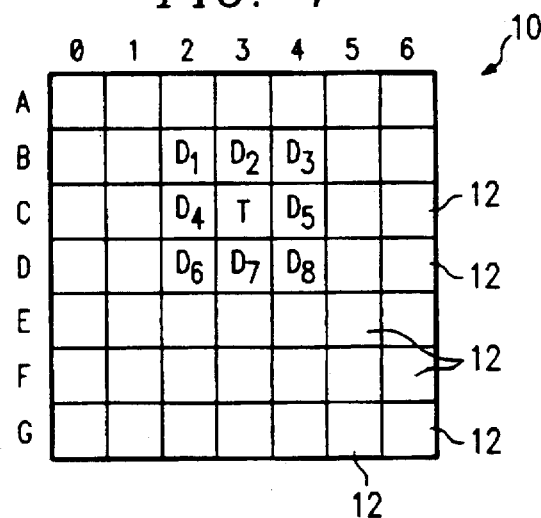
FIG. 1 illustrates a representation of a memory test procedure.
Figure 2:
FIG. 2 illustrates a timing diagram associated with the memory test of FIG. 1 using prior art techniques.

FIG. 1 illustrates a representation of a typical memory test. For purposes of illustration, a memory array 10 is shown having forty-nine cells 12, addressable by rows A–G and columns 0–6. Real memory circuits could comprise millions of cells. In this example, it will be assumed that each addressable location in the memory comprises a one bit cell. The present invention, however, will work with any configuration, as would be known to one skilled in the art.

In testing a memory, data is written into the memory array and subsequently read out to determine whether the written value has been properly stored. For example, if a "one" is written into location C3, that location would be read to determine whether a "one" was still present.

In a faulty memory array, writing data to adjacent cells may "disturb" the value in the cell being tested. Naturally, it is important that the data be securely stored in a cell regardless of data written into adjacent cells. Therefore, a "write disturb" test is often performed in which data is written into one cell, and other data is written into adjacent cells. The data in the cell being tested is then read out to determine whether it was properly stored.

In the example of FIG. 1, the cell being tested is cell C3. Hence, test data $T_1$ would be written into cell C3, and disturbed test data $D_1$–$D_8$ would be written into the adjacent cells, namely cells B2–4, C2 and C4, and D2–4. As can be seen from FIGS. 1–2, for each cell tested, nine write operations and one read operation must be performed. Thus, for a one megabit memory, in this particular sequence, nine million write operations and one million read operations would be performed, one test on a single chip. Considering the vast number of chips that may be formed on a wafer, the time needed to test each chip on the wafer will be very large.

In the prior art, in order to test multiple circuits simultaneously, a corresponding number of testers would be necessary. Since test equipment is extremely expensive, this is not a realistic alternative to significantly speed testing.

FIG. 3 illustrates a block diagram of a memory circuitry according to the present invention. The memory circuitry 14 includes a memory cell array 16 coupled to test circuitry 18. The memory cell array 16 receives address and control signals, such as the Row Address Strobe ($\overline{RAS}$), Column Address Strobe ($\overline{CAS}$), Address, Data Input, Write Enable ($\overline{WE}$), and Data Output signals. Data output from the memory cell array 16 is coupled to the test circuitry 18, which also receives external test signals. The test circuitry outputs data.

In operation, the test circuitry 18 is operable to store data read from the memory cell array 16 responsive to the test signals without outputting the data. The data may be selectively output from the memory circuit 14 responsive to the test signals. This aspect of the invention is described in greater detail in connection with FIGS. 5 and 6.

FIG. 4 illustrates a preferred embodiment for the test circuitry 18. The test circuitry comprises a data register 20 coupled to the memory cell array. The output of the data register 20 is coupled to a switch 22 which is controlled by the test signal TST. An invertor 24 provides an inverted TST signal to switch 26 which receives input from the memory cell array. The outputs of switches 22 and 26 are connected to the input of a buffer 28, whose output is controlled by an Output Enable signal in test mode (OET). The output of the buffer 28 may be coupled to the test equipment. Similarly, signals TST and OET are provided by the test equipment to nodes on the fabricated circuit. Unless the test is to be performed after fabrication of the packaged device, the TST and OET signals need not be connected to a package pin of the eventual device. As would be known to one skilled in the art, it is possible to apply the same test method to after packaged devices by supplying the test circuits shown in FIG. 4 as off-chip devices.

During normal operation (non-test operation) of the circuit, the TST signal is low, thereby enabling switch 26 to pass data from the memory cell array 16 to the buffer 28, while disabling switch 22. The OET signal is similarly low, thereby passing data from the memory cell array to the output. Thus, with signals TST and OET low, the memory circuit 14 operates like a normal memory device. The low TST and OET signals can be provided by using a pull-down resistor coupled between the TST and OET nodes (which are connected to the tester) and ground. Thus, the TST and OET signals will normally be low, unless a logical high signal is applied to one of the nodes by the tester.

In a test operation, however, data from the memory cell is temporarily stored in the data register 20. A logical high TST signal disables switch 26 and enables switch 22 thereby passing data from the output of the data register 20 to the input of the buffer 28. A logical high OET signal keeps the output buffer impedance high preventing the output of data from the data register 20. The data in the memory cells can be transferred to the data register 20 by setting the $\overline{WE}$ signal high (i.e., by the setting the memory circuit into the read mode in the normal manner). The data stored in the data register 20 can only by output through the output buffer when the OET signal goes low and the TST signal is high. The content of the data register 20 will be overwritten only when $\overline{WE}$ goes high and the memory performs a read. Otherwise, the data register 20 maintains the previously read data.

Referring to FIG. 5, a single tester 30 can be connected to a plurality of memory circuits 14. As shown in FIG. 5, $\underline{m}$ memory circuits 14 are being tested simultaneously by the tester 30. The $\overline{RAS}$, $\overline{CAS}$, $\overline{WE}$, Address signals ($A_0$–$A_n$), data input signals ($D_0$–$D_n$) and TST signals are connected from the tester 30 to the devices 14 in parallel. The tester 30 receives the outputs ($O_0$–$O_n$) over a single bus. Thus, if the devices 14 were arranged as 1M'1 memories, a single line would connect the outputs from each of the devices. If the devices 14 were arranged as 256K×4, the tester 30 would receive the outputs over a four-line bus. The tester 30 is coupled to the OET nodes of the memory circuits 14 over separate lines. Hence, $\underline{m}$ lines are output from the test equipment to the devices for the OET signal.

In operation, the tester 30 generates a logical signal high to the TST and OET nodes indicating that a test is to be performed. Test data is written to the memory circuits 14 in parallel by the tester 30 which includes circuitry for generating the test data and for generating the proper control signals. Thus, in the test illustrated in FIG. 1, the nine write operations would be performed simultaneously to all $\underline{m}$ memory circuits 14. Similarly, the read operation would be performed on all $\underline{m}$ memory circuits simultaneously, with the output from the memory cell array 16 stored in the data register 20 associated with each memory circuit. Since the OET signal to each device will initially be high, the data will not be output from the memory circuits 14 to the tester 30, but the test data will be available at the inputs of each of the buffers 28, since the TST signal is high. Subsequently, the OET line associated with each memory circuit 14 may be sequentially strobed to enable each device to output the data from its data register to the test equipment in sequence.

Referring to FIG. 6, a timing diagram illustrating the test method is shown. For purposes of illustration, the test described in connection with FIG. 1 is shown; however, the present invention is operable to increase testing efficiency for any test.

At time period $t_1$, data is written into the cell being tested ($t_1$). From times $t_2$–$t_9$, the disturb data ($D_1$–$D_8$) are written into the adjacent cells. At $t_{10}$, the data written into the cell being tested is transferred to the data register 20. From $t_{11}$–$t_{11+m-1}$, the data stored in the register 20 of each device is sequentially read from the memory circuits 14 as each memory circuit's OET signal is sequentially pulled low.

Thus, $\underline{m}$ cells (on $\underline{m}$ different chips) may be tested in 10+ $\underline{m}$ clock cycles using a signal tester. Therefore, if ten memory circuits were tested simultaneously, ten cells could be tested in twenty clock cycles. In the prior art, one hundred clock cycles would be required to test ten cells. The data from the data register 20 may be compared by the tester 30 to determine its validity while the next cell is being tested.

As shown in FIG. 6, the present invention is capable of providing even greater efficiency, since data can be written to the cells of the memory array while the output buffers are strobed by the tester 30. As shown, during read out of the test data from the data registers, a second set of test data is written into the next cell to be tested ($T_2$) and its associated disturb cells ($D_1$–$D_8$). Thus, for the example shown with ten memory circuits being tested, the effective test rate can be as high as one cell per clock cycle.

Thus, the present invention allows multiple memory circuits to be tested simultaneously using a single tester. The present invention will increase the test rate of any memory test because of the efficiency of parallel reading and writing to and from the memory array. When the memory cells are tested such that data is written to the memory array as data from the data registers is read into the tester, efficiency is optimized.

Although the present invention has been described in detail, it should be understood that various changes, substitutions and alterations can be made herein without departing from the spirit and scope of the invention as defined by the appended claims.

What is claimed is:

1. A method of testing a plurality of memory arrays, comprising the steps of:

simultaneously writing at least one data bit into a selected memory cell in each of said plurality of memory arrays, wherein each memory array comprises a separate integrated circuit;

subsequently writing to neighboring cells of said selected memory cell in each of said memory arrays simultaneously;

simultaneously reading said data bit from said selected memory cell in each of said plurality of memory arrays and storing said bit read from each of said memory arrays in a plurality of storage registers, at least one of said storage registers being provided for each of said memory arrays;

separately reading the data stored in each of said storage registers into a single tester for comparison with an expected value to determine its validity; and writing a second data bit into said plurality of memory arrays while data is being concurrently read from the storage registers.

2. A method of testing a plurality of integrated circuit memories, comprising the steps of:

simultaneously writing test data into predetermined cells associated with respective memories, wherein said integrated circuit memories comprise separate integrated circuits;

simultaneously reading test data from the predetermined cells;

storing the read test data in respective storage cells associated with each of the memories;

sequentially reading the test data stored in the storage cells into a single tester for comparison with an expected value to determine its validity; and simultaneously writing additional test data to the separate integrated circuit memories while data is being concurrently read from the storage cells.

3. A method of testing a plurality of memory arrays, comprising the steps of:

simultaneously writing a data bit into each of said plurality of memory arrays, wherein each memory array comprises a separate integrated circuit;

simultaneously reading said data bit from said plurality of memory arrays and storing said bit read from each of said memory arrays in a plurality of storage registers, at least one of said storage registers being provided for each of said memory arrays;

separately reading the data stored in each of said storage registers into a single tester for comparison with an expected value to determine its validity;

said writing further comprises writing to a selected memory cell in each of said memory arrays simultaneously and subsequently writing to neighboring cells of said selected memory cell in each of said memory arrays simultaneously, and wherein said simultaneous reading comprises reading said selected memory cell in each of said memory arrays; and writing a second data bit into said plurality of memory arrays while data is being concurrently read from the storage registers.

* * * * *